United States Patent
Lee

(10) Patent No.: US 7,372,762 B2
(45) Date of Patent: *May 13, 2008

(54) SEMICONDUCTOR MEMORY DEVICE

(75) Inventor: Hyun-Cheol Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/704,073

(22) Filed: Feb. 7, 2007

(65) Prior Publication Data

US 2007/0133336 A1 Jun. 14, 2007

Related U.S. Application Data

(63) Continuation of application No. 11/149,788, filed on Jun. 9, 2005, now Pat. No. 7,203,119.

(30) Foreign Application Priority Data

Dec. 28, 2004 (KR) .............. 10-2004-0113610

(51) Int. Cl.
 *G11C 11/00* (2006.01)
(52) U.S. Cl. .................... 365/226; 365/203
(58) Field of Classification Search ........... 365/226, 365/203
 See application file for complete search history.

(56) References Cited

U.S. PATENT DOCUMENTS

| | | | |
|---|---|---|---|
| 5,258,958 A | 11/1993 | Iwahashi et al. ....... 365/185.21 |
| 5,325,337 A | 6/1994 | Buttar .................. 365/210 |
| 6,212,120 B1* | 4/2001 | Nakamura et al. ........ 365/227 |
| 6,754,122 B2* | 6/2004 | Wada et al. ............. 365/207 |
| 6,914,835 B2* | 7/2005 | Nakamura et al. ........ 365/203 |
| 6,982,899 B2* | 1/2006 | Sumitani et al. ......... 365/154 |
| 7,203,119 B2* | 4/2007 | Lee .................... 365/226 |
| 2003/0133321 A1 | 7/2003 | Jo ..................... 365/149 |
| 2003/0174545 A1* | 9/2003 | Wada et al. .......... 365/189.09 |
| 2004/0113176 A1* | 6/2004 | Honma et al. ........... 257/200 |
| 2004/0141362 A1* | 7/2004 | Sumitani et al. ......... 365/154 |
| 2005/0105373 A1* | 5/2005 | Takase et al. ........... 365/232 |
| 2005/0286301 A1 | 12/2005 | Mochizuki ........... 365/185.17 |
| 2006/0044907 A1* | 3/2006 | Forbes et al. ........... 365/207 |

* cited by examiner

*Primary Examiner*—Michael T Tran
(74) *Attorney, Agent, or Firm*—Blakely, Sokoloff, Taylor & Zafman LLP

(57) ABSTRACT

The present invention is related to a semiconductor memory device improving refresh performance by reliably generating an internal voltage. The internal voltage generator for use in the semiconductor memory device includes a cell plate voltage generator, a driving voltage generator, and a bit line precharge voltage generator. The bit line precharge voltage generator includes a half driving voltage generator for receiving the driving voltage to thereby generate the bit line precharge voltage, a second reference voltage generator for generating the second reference voltage, and a bit line precharge voltage releasing device for discharging a surplus voltage.

14 Claims, 5 Drawing Sheets

SEMICONDUCTOR MEMORY DEVICE

The present patent application is a Continuation of application Ser. No. 11/149,788, filed Jun. 9, 2005 now U.S. Pat. No. 7,203,119.

FIELD OF INVENTION

The present invention relates to a semiconductor memory device; and, more particularly, to a semiconductor memory device for improving refresh performance by reliably generating an internal voltage.

DESCRIPTION OF PRIOR ART

An internal voltage generator in a semiconductor memory device is a circuit for receiving an external voltage VDD and generating an internal voltage having various levels.

The internal voltage generator converts the inputted power voltage VDD having a relatively high voltage level into the internal voltage having a low voltage level for used in an operation of the semiconductor memory device. Due to the internal voltage generator, it is possible to reduce an electric power consumption of the semiconductor memory device and to improve a performance of the semiconductor memory device.

Recently, it is requested a semiconductor memory device which can consume less power, and, therefore, the internal voltage generator is widely used in the semiconductor memory device such as a DRAM.

Meanwhile, for a stable operation of the semiconductor memory device having the internal voltage generator, it is required to generate the internal voltage reliably regardless with changes of temperature, process, and pressure.

FIG. 1 is a block diagram showing an internal voltage generator in a conventional semiconductor memory device.

As shown, the conventional internal voltage generator includes a core voltage generator 10 for generating a core voltage VCORE with an external power supply voltage VDD, a driving voltage generator 20 for generating a driving voltage VDL with the external power supply voltage VDD, a half core voltage generator 30 for generating a cell plate voltage VCP having half voltage level of the core voltage VCORE, and a precharge voltage generator 40 for generating a bit line precharge voltage VBLP having half voltage level of the driving voltage VDL.

Further, the core voltage generator 10 includes a core reference voltage generator 14 for generating a core reference voltage VCORE_REF, a core voltage driver 16 for providing the core voltage VCORE corresponding to a level of the core reference voltage VCORE_REF, and a core reference voltage level controller 12 for controlling the level of the core reference voltage VCORE_REF through fuse option.

The driving voltage generator 20 includes a driving reference voltage generator 24 for generating a driving reference voltage VDL_REF, a driving voltage driver 26 for providing the driving voltage VDL corresponding to a level of driving reference voltage VDL_REF, a driving reference voltage level controller 22 for controlling the level of the driving reference voltage VDL_REF through fuse option.

Looking at the operation of the internal voltage generator briefly, the core voltage driver 16 provides the core voltage VCORE corresponding to the level of the core reference voltage VCORE_REF. In the same way, the driving voltage driver 26 provides the driving voltage VDL in response to the driving reference voltage VDL_REF.

Also, the half core voltage generator 30 provides the cell plate voltage VCP having half voltage level of the core voltage VCORE; and the half driving voltage generator 40 outputs the bit line precharge voltage VBLP having half voltage level of the driving voltage VDL.

Hereinafter, a core block of the semiconductor memory device receiving power supply voltage generated by the abovementioned internal voltage generator and level variation of the power supply voltage in response to operation of the core block are explained.

FIG. 2 is a schematic circuit diagram of a core block in a general semiconductor memory device.

Referring to FIG. 2, the core block includes a unit memory cell array 58 for data storing, upper and lower bit-line pairs BL and BLB, terminal pairs SA and SAB of bit-line sensor amplifier 50, upper and lower bit-line separating blocks 52 and 54, a precharging block 56, and a bit-line sensor amplifier 50.

When word-lines WL0 and WL1 are activated, the upper and lower bit-line pairs BL and BLB receive data on the memory cell array 58 and share the bit-line sensor amplifier 50.

The terminal pairs SA and SAB of bit-line sensor amplifier 50, being actual objects of sensing and amplifying operation of the bit-line sensor amplifier 50, have a memory cell data on chosen partial portion of upper and lower bit-line pair BL and BLB, wherein the chose partial portion of upper and lower bit-line pair BL and BLB is continuous.

The upper and lower bit-line separating block 52 and 54 are for connecting or separating the upper and lower bit-line pair BL and BLB and the terminal pairs SA and SAB of bit-line sensor amplifier 50 in response to a bit-line separating signals BISH and BISL.

The precharging block 56 is for precharging the terminal pairs SA and SAB of bit-line sensor amplifier 50 in response to a bit-line equalizing signal BLEQ.

The bit-line sensor amplifier 50 senses and amplifies a voltage difference between the terminal pairs SA and SAB of the bit-line sensor amplifier 50.

FIG. 3A is a timing diagram showing operation of the core block shown FIG. 2.

FIG. 3B is a diagram showing voltage level variation of the power supply voltage VCORE.

Referring to FIG. 3A and FIG. 3B, the operation of the core block and the voltage level variation of the power supply voltage VCORE in response to an access to the memory cell array 580 is explained.

First of all, the word-line WL0 is activated by an active command ACT, and then, the data of the memory cell array 58 is flowed into the upper bit-line BL as a minute voltage $\Delta V + \beta$.

Then, a bit-line sensor amplifier operational signal S/A_EN is activated, and then, the bit-line sensor amplifier 50 senses the voltage difference between the upper bit-line BL and the lower bit-line BLB and amplifies the difference as level of the power supply voltage VCORE and a ground voltage VSS.

Subsequently, the word-line WL0 is inactivated by a precharge command PCG, then the data of the upper bit-line BL amplified by the bit-line sensor amplifier 50 is re-stored in the memory cell array 58.

The precharging block 56 connects the upper and lower bit-line pair BL and BLB in response to activation of the bit-line equalizing signal BLEQ and precharges the upper and lower bit-line pair BL and BLB into bit line precharge voltage VBLP level.

Meanwhile, in the case of guaranteeing a tRPmin in accordance with JEDEC spec. and accessing to a word-line WL1 in the same unit memory cell array 58 with the word-line WL0 continuously, the precharge level of the upper and lower bit-line pair BL and BLB have a value of VCORE/2, and then, the data of the memory cell array 58 is flowed into the upper bit-line BL as a minute voltage ΔV. Herein, the tRPmin means minimum time required for applying next active command ACT after former precharge command PCG is applied.

As abovementioned, the level of the minute voltage applied to the bit-line BL is lowered as much as β every memory access. This is because of the charge sharing law. In other words, the difference of the bit line precharge voltage VBLP level between the bit-line pair BL and BLB in every memory access causes the difference β of the minute voltage.

FIG. 4A is a schematic diagram of a unit memory cell and a bit-line.

Referring to FIG. 4A, the unit memory cell is provided with a NMOS transistor NM1, a capacitor CS connected between a node N2 and the cell plate voltage VCP, and a parasitic capacitor CBL connected to the bit-line BL. Herein, a gate of the NMOS transistor NM1 is connected to a word-line, and a source-drain path is between the node N2 and the bit-line BL. A node N1 is a connection node of the bit-line BL and the NMOS transistor NM1.

FIG. 4B is another diagram of the unit memory cell and the bit-line shown in FIG. 4A.

Referring to FIG. 4B, the NMOS transistor NM1 of FIG. 4A is replaced with a switch for switching the bit-line BL and the node N2 according to whether the word-line WL is activated or not.

When the word-line WL is not activated, and so the switch is not turned on, the node N1 has a level of the bit line precharge voltage VBLP and the node N2 has a level of the power supply voltage VCORE. After the switch is turned on, the nodes N1 and N2 have equivalent voltage level.

Therefore, organizing the aforementioned, Equation 1 is obtained as follows.

$$C_S \times (VCORE - VCP) + C_{BL} \times VBLP = (C_S + C_{BL}) \times V \quad \text{(Eq. 1)}$$

In Equation 1, V denotes the voltage level of the nodes N1 and N2 when the switch is turned on and $C_S$ and $C_{BL}$ are capacitances of the capacitor CS and the parasitic capacitor CBL, respectively.

If it is presumed that the data stored in memory cell has the level of the power supply voltage VCORE as a logic level 'H', i.e., when V is VH, Equation 2 is obtained as follows.

$$VH = \left(\frac{1}{1 + C_{BL}/C_S}\right)(VCORE - VCP) + \left(\frac{C_{BL}/C_S}{1 + C_{BL}/C_S}\right)VBLP \quad \text{(Eq. 2)}$$

The Equation 2 is applied when the level of the bit line precharge voltage of the bit-line is the ground voltage VSS.

Therefore, in order to applying the Equation 2 when the level of the bit line precharge voltage of the bit-line is the precharge voltage VBLP, the bit line precharge voltage VBLP is subtracted from the right hand of the Equation 2. Then, Equation 3 below is obtained.

$$VH = \left(\frac{1}{1 + C_{BL}/C_S}\right)(VCORE - VCP - VBLP) \quad \text{(Eq. 3)}$$

Referring to Equation 3, the lower the level of the bit line precharge voltage VBLP, the higher the minute voltage of the memory cell applied to the bit-line.

In other words, though the voltage level of data in the memory cell is fixed, the level of the minute voltage of the memory cell applied to the bit-line is changed because of the change of the bit line precharge voltage VBLP level.

Therefore, the voltage difference β in FIG. 3 is also caused by the difference of the bit line precharge voltage level between the first and second access to the memory cell.

Meanwhile in the internal voltage generator in accordance with the conventional art, in the case of only guaranteeing the tRPmin and continuously accessing to the word-line, the level of the bit line precharge voltage VBLP is raised because a driving amount of the precharge voltage generator is smaller than that of the core voltage generator.

Therefore, the precharge efficiency becomes worse because the level of the minute voltage of the memory cell applied to the bit-line gets lower even if the voltage level of data stored in the memory cell is fixed.

SUMMARY OF INVENTION

It is, therefore, an object of the present invention to provide a semiconductor memory device improving refresh feature by reliably generating an internal voltage.

In accordance with an aspect of the present invention, there is provided an internal voltage generator including a cell plate voltage generator for receiving an external power supply voltage to thereby generate a cell plate voltage supplied to unit cells, a driving voltage generator for receiving an external power supply voltage to thereby output a driving voltage having a first reference voltage level, and a bit line precharge voltage generator for receiving the driving voltage to thereby output the bit line precharge voltage having the second reference voltage level. Herein, the precharge voltage generator includes a half driving voltage generator for receiving the driving voltage to thereby generate the bit line precharge voltage, a second reference voltage generator for generating the second reference voltage, and a bit line precharge voltage releasing device for discharging a surplus voltage.

In accordance with another aspect of the present invention, there is provided an internal voltage generator for use in a semiconductor memory device including a cell plate voltage generator for receiving an external power supply voltage to thereby generate a cell plate voltage supplied to unit cells, a driving voltage generator for receiving an external power supply voltage to thereby output a driving voltage having a first reference voltage level, and a bit line precharge voltage generator for receiving the driving voltage to thereby output the bit line precharge voltage having the second reference voltage level. Herein, the bit line precharge voltage generator includes a half driving voltage generator for receiving the driving voltage to thereby generate the bit line precharge voltage, a second reference voltage generator for generating the second reference voltage, and a bit line precharge voltage releasing device for discharging a surplus voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal voltage generator in accordance with the present invention will be described in detail referring to the accompanying drawings.

Figure 1:
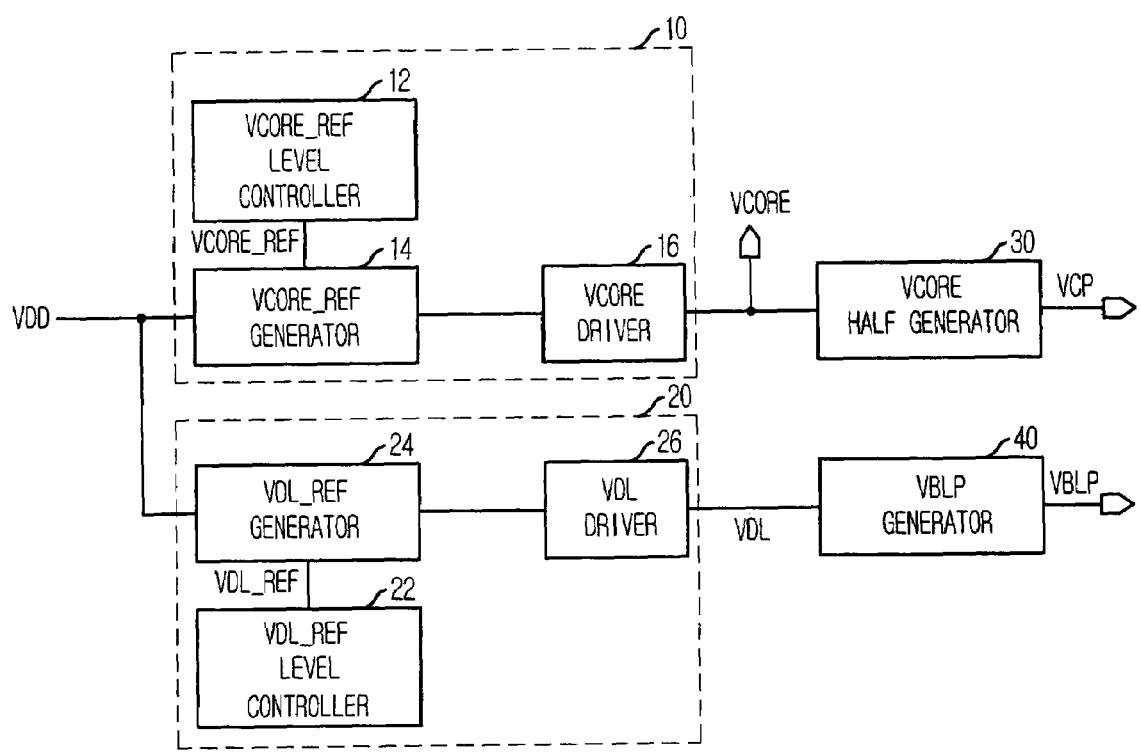
FIG. 1 is a block diagram of a internal voltage generator in a semiconductor memory device in accordance with the conventional art.
Figure 2:
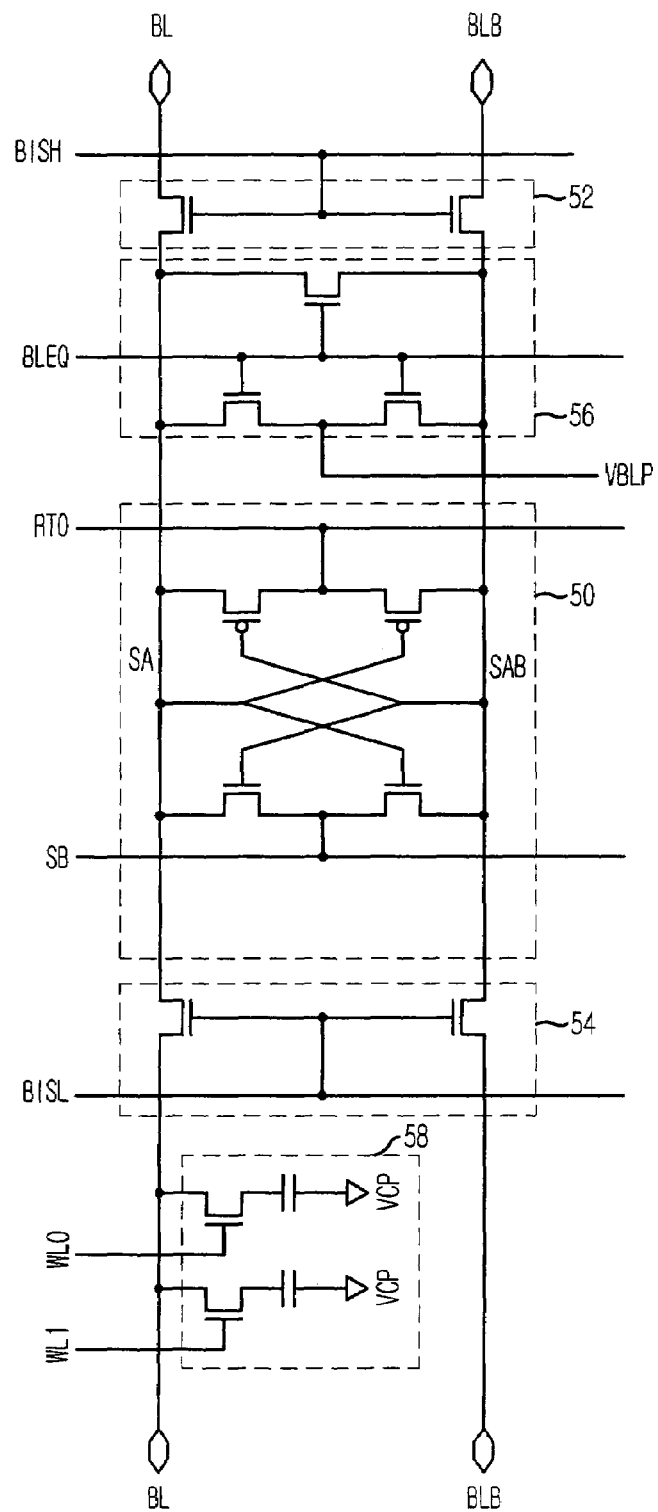
FIG. 2 is a schematic circuit diagram of a core block in a general semiconductor memory device.
Figure 3A:
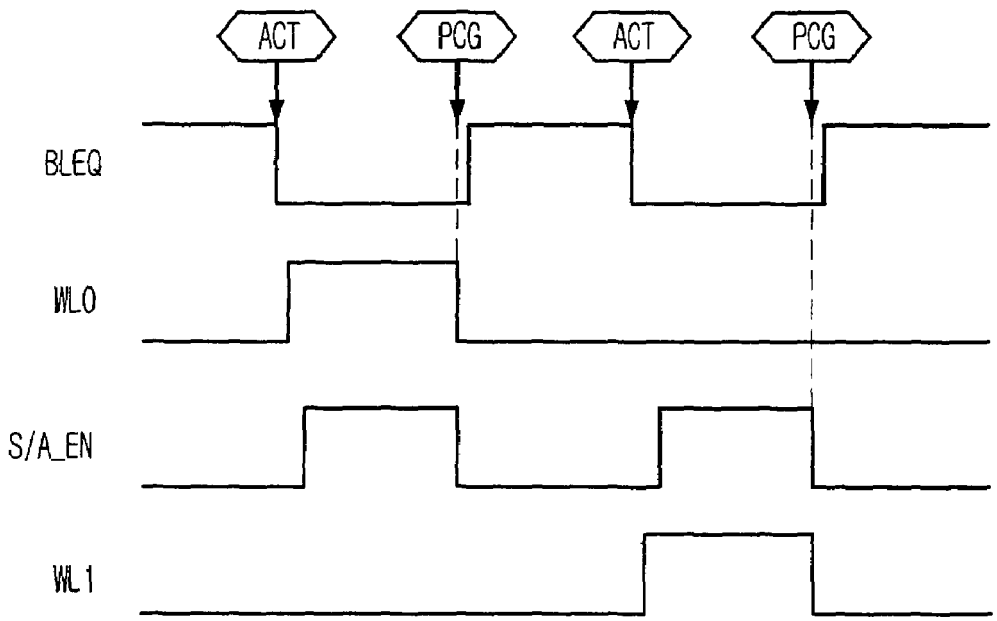
FIG. 3A is a timing diagram showing operation of the core block shown FIG. 2.
Figure 3B:
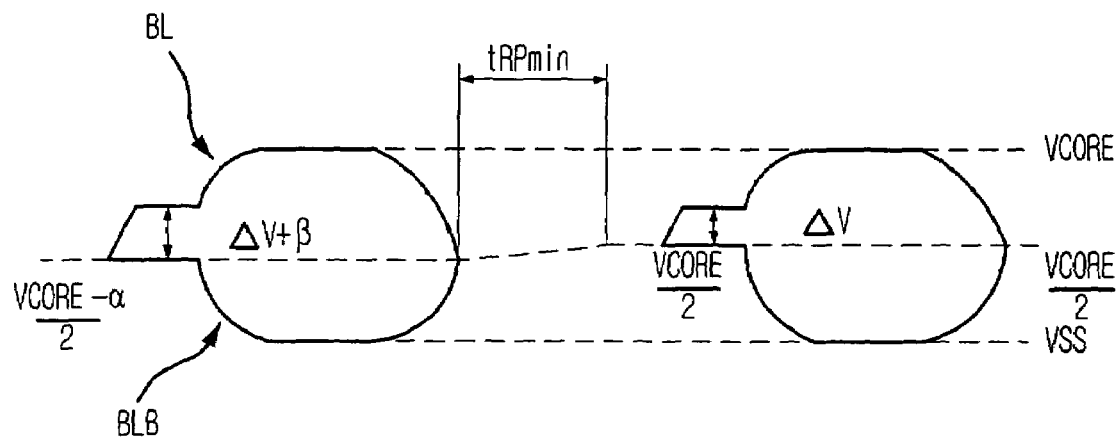
Figure 4A:
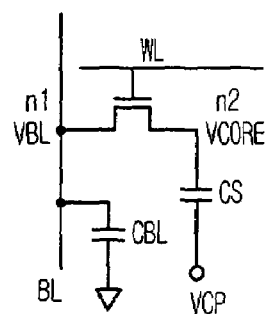
FIG. 4A is a schematic diagram of a unit memory cell and a bit-line.
Figure 4B:
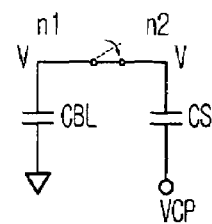
FIG. 4B is another diagram of the unit memory cell and the bit-line shown in FIG. 4A.
Figure 5:
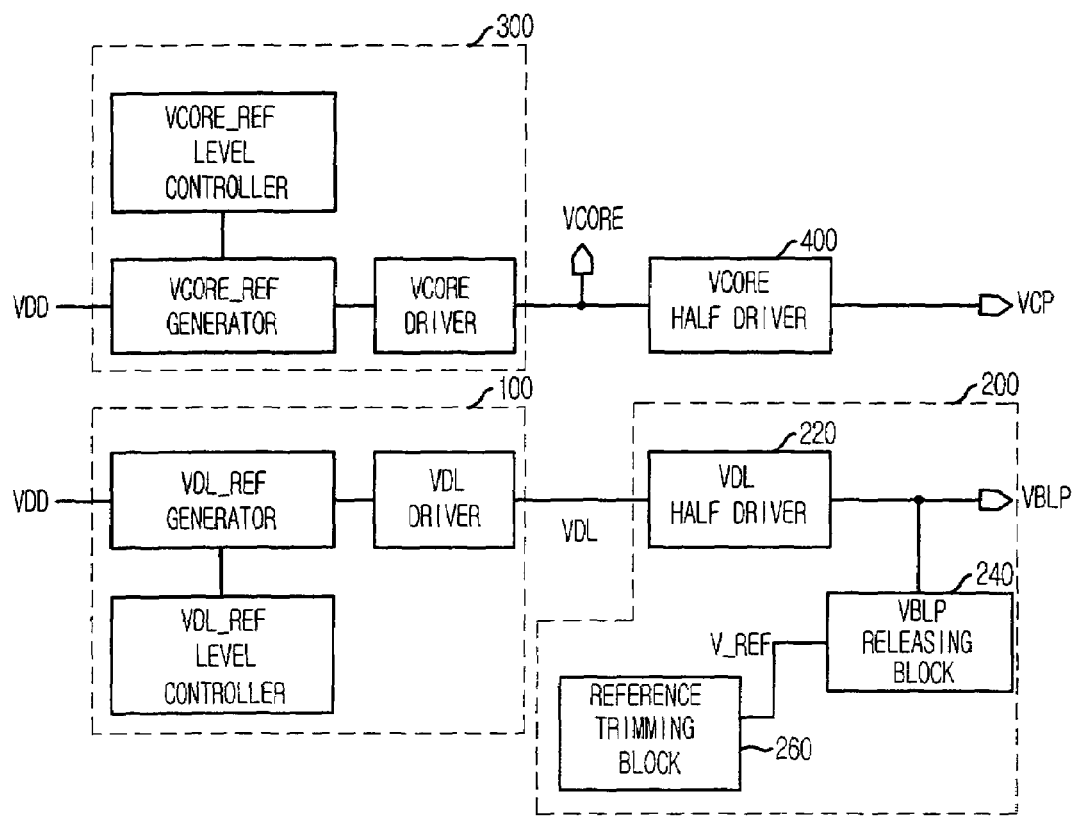
FIG. 5 is a block diagram showing an internal voltage generator in a semiconductor memory device in accordance with a preferred embodiment of the present invention.

FIG. 5 is a block diagram showing an internal voltage generator in a semiconductor memory device in accordance with a preferred embodiment of the present invention.

Referring to FIG. 5, the internal voltage generator is provided with a driving voltage generator 100 and a precharge voltage generator 200. The driving voltage generator 100 generates a driving voltage VDL with an external power supply a voltage VDD.

Further, the precharge generator 200 includes a half driving voltage driver 220, a reference trimming block 260 and a precharge voltage releasing block 240. The half driving voltage driver 220, generates a bit line precharge voltage VBLP having about half voltage level of the driving voltage VDL.

The reference trimming block 260 controls level of a reference voltage V_REF to generates the bit line precharge voltage VBLP of an expecting voltage level. The precharge voltage releasing block 240 is for making the bit line precharge voltage VBLP hold level of the reference voltage V_REF.

Meanwhile, the internal voltage generator further includes a core voltage generator 300 for generating a core voltage VCORE from the external power supply voltage VDD and a half core voltage driver 400 for generating a cell plate voltage VCP having about half voltage level of the core voltage VCORE.

The driving voltage generator 100 and the core voltage generator 300 has the same block structure with those in the conventional art, therefore, the detailed explanation is omitted.

Figure 6:
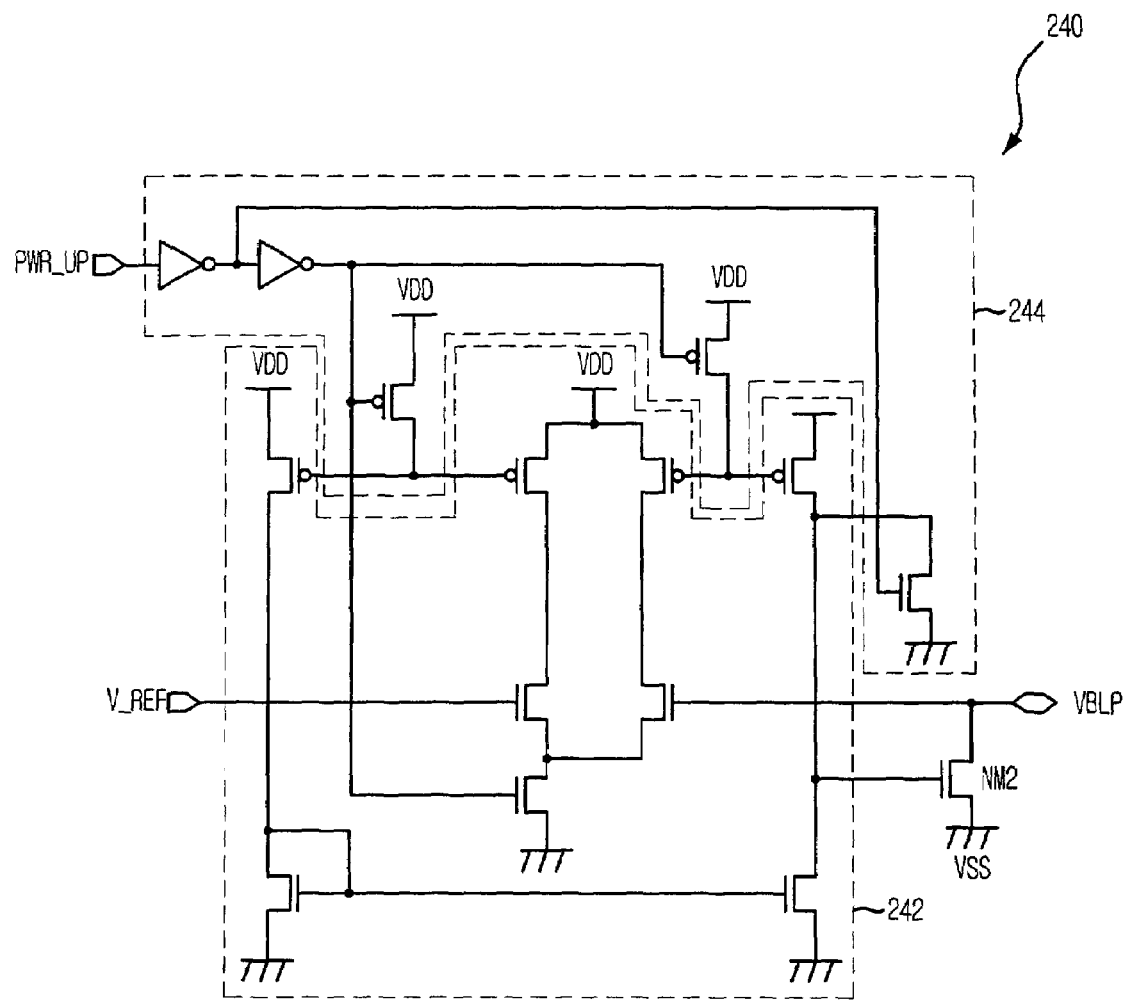
FIG. 6 is a schematic circuit diagram of the VBLP releasing block shown in FIG. 5.

FIG. 6 is a schematic circuit diagram of the VBLP releasing block 240 shown in FIG. 5.

Referring to FIG. 6, the precharge voltage releasing block 240 is constituted with a level sensing block 242, an initializing block 244, and a discharge driver NM2. The level sensing block 242 senses the level of the bit line precharge voltage VBLP and outputs a level sensing signal SEN_LV. The initializing block 244 is for initializing the level sensing block 242 in response to a power up signal PWR_UP. The discharge driver NM2 is implemented with a NMOS transistor whose gate receives the level sensing signal SEN_LV and whose drain-source path is connected between a providing terminal of the bit line precharge voltage VBLP and the ground voltage VSS.

Looking at the operation of the internal voltage generator, the VDL generator 100 converts the external power supply voltage VDD into the power supply voltage VDL. Then, VDL half driver 220 generates the bit line precharge voltage VBLP having about half voltage level of the power supply voltage VDL. In the VBLP releasing block 240, the level sensing block 242 senses the level of the output of the VDL half driver 220, i.e., the bit line precharge voltage VBLP and compares the bit line precharge voltage VBLP and the reference voltage V_REF. Then, in the case that the level of the bit line precharge voltage is higher than the level of the reference voltage V_REF outputted from the reference trimming block 260, the discharge driver NM2 discharges a surplus voltage, wherein the surplus voltage has the value of subtracting the reference voltage V_REF from the bit line precharge voltage VBLP.

Figure 7:
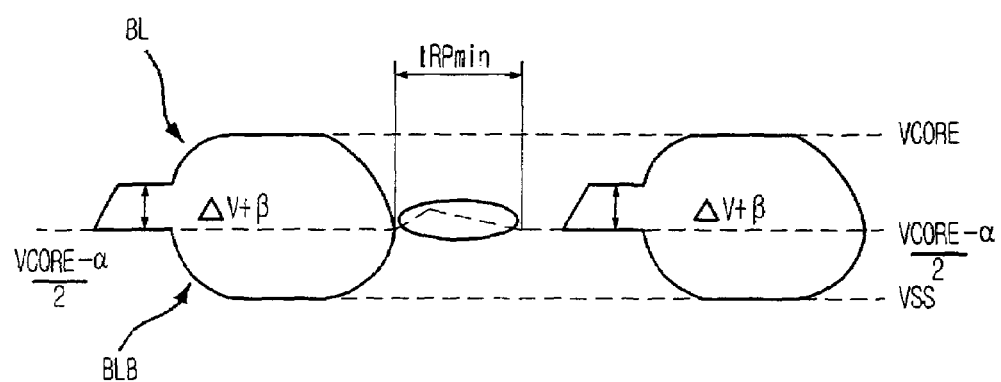
FIG. 7 is a diagram showing the level changes of the internal voltage of the present invention in response to the access to the memory cell.

FIG. 7 is a diagram showing the level changes of the internal voltage of the present invention in response to the access to the memory cell.

Referring to FIG. 7, the internal voltage generator makes the level of the bit line precharge voltage VBLP hold the bit line precharge voltage VBLP level originally adjusted by the half driving voltage driver 220, i.e., (VCORE/2−α) in the case of only guaranteeing the tRPmin and accessing to the word-line WL1 in the same memory cell array 58 continuously.

In other words, as the level of the bit line precharge voltage VBLP is dropped as much as α, the level of the minute voltage of the memory cell supplied to the bit-line BL is raised as much as β. Accordingly, the margin as much as β to determine the logic level of data is obtained.

Therefore, the semiconductor memory device using the internal voltage generator of the present invention holds the level of the bit line precharge voltage VBLP as (VCORE/2−α) though the bit line precharge voltage of the bit-line pair BL and BLB is raised.

That is, the present invention lowers the refresh frequency, and therefore, the refresh performance of a semiconductor memory device is improved.

The internal voltage generator in accordance with the present invention improves the refresh performance of the semiconductor memory device by letting down the level of the bit line precharge voltage VBLP than VCORE/2 and by making the margin to be the surplus in accordance with the charge sharing law.

The present application contains subject matter related to Korean patent application No. 2004-113610, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A precharge controller for use in a semiconductor memory device, comprising:

a precharge voltage generator for generating a precharge voltage based on a power supply voltage to supply the precharge voltage into a bit line;

a reference voltage generator for generating a reference voltage having a constant level for precharging operation; and a precharge voltage releaser for discharging a surplus voltage on the bit liner, wherein the surplus voltage has a value of subtracting the reference voltage from the precharge voltage when the precharge voltage is larger than the reference voltage.

2. The precharge controller of claim 1, wherein the reference voltage has about a half voltage level of the power supply voltage.

3. The precharge controller of claim 1, wherein the precharge voltage releaser includes:

a level sensor for comparing the precharge voltage with the reference voltage to thereby output a level sensing signal;

an initializer for initializing the level sensor in response to a power-up signal; and a discharge driver for discharging the surplus voltage in response to the level sensing signal.

4. The precharge controller of claim 3, wherein the discharge driver is implemented with a NMOS transistor coupled to a ground voltage, wherein a gate of the NMOS transistor is coupled to the level sensing signal.

5. The precharge controller of claim 3, wherein the level sensor includes a current mirror.

6. A semiconductor memory device, comprising:

a bit line for transmitting a data;

a precharge voltage generator for generating a precharge voltage based on a power supply voltage to supply the precharge voltage into the bit line;

a reference voltage generator for generating a reference voltage having a constant level for precharging operation; and a precharge voltage releaser for discharging a surplus voltage on the bit line, wherein the surplus voltage has a value of subtracting the reference voltage from the precharge voltage when the precharge voltage is larger than the reference voltage.

7. The semiconductor memory device of claim 6, further comprising:

a plurality of cells for storing data, each cell coupled to the bit line and a cell plate line; and a cell plate voltage generator for generating a cell plate voltage supplied to unit cells based on the power supply voltage.

8. The semiconductor memory device of claim 6, wherein the reference voltage has about a half voltage level of the power supply voltage.

9. The semiconductor memory device of claim 6, wherein the precharge voltage releaser includes:

a level sensor for comparing the precharge voltage with the reference voltage to thereby output a level sensing signal;

an initializer for initializing the level sensor in response to a power-up signal; and a discharge driver for discharging the surplus voltage in response to the level sensing signal.

10. The semiconductor memory device of claim 9, wherein the discharge driver is implemented with a NMOS transistor coupled to a ground voltage, wherein a gate of the NMOS transistor is coupled to the level sensing signal.

11. The semiconductor memory device of claim 9, wherein the level sensor includes a current mirror.

12. A method for controlling a precharge voltage in a semiconductor memory device, comprising:

generating the precharge voltage based on a power supply voltage to supply the precharge voltage into a bit line;

generating a reference voltage having a constant level for precharging operation; and discharging a surplus voltage on the bit line, wherein the surplus voltage has a value of subtracting the reference voltage from the precharge voltage when the precharge voltage is larger than the reference voltage.

13. The method of claim 12, wherein the reference voltage has about a half voltage level of the power supply voltage.

14. The method of claim 12, wherein the generating the precharge voltage includes:

comparing the precharge voltage with the reference voltage to thereby output a level sensing signal;

initializing the level sensor in response to a power-up signal; and discharging the surplus voltage in response to the level sensing signal.

* * * * *

UNITED STATES PATENT AND TRADEMARK OFFICE
CERTIFICATE OF CORRECTION

PATENT NO. : 7,372,762 B2 Page 1 of 1
APPLICATION NO. : 11/704073
DATED : May 13, 2008
INVENTOR(S) : Hyun-Cheol Lee It is certified that error appears in the above-identified patent and that said Letters Patent is hereby corrected as shown below:

In Column 7, line 8, please delete "liner," and insert -- line, --.

Signed and Sealed this

Twenty-fifth Day of August, 2009

David J. Kappos
*Director of the United States Patent and Trademark Office*